(12) United States Patent
Adam et al.

(10) Patent No.: US 9,059,139 B2
(45) Date of Patent: Jun. 16, 2015

(54) RAISED SOURCE/DRAIN AND GATE PORTION WITH DIELECTRIC SPACER OR AIR GAP SPACER

(71) Applicant: International Business Machines Corporation, Armonk, NY (US)

(72) Inventors: Thomas N. Adam, Slingerlands, NY (US); Kangguo Cheng, Schenectady, NY (US); Ali Khakifirooz, San Jose, CA (US); Juntao Li, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/556,638

(22) Filed: Dec. 1, 2014

(65) Prior Publication Data

US 2015/0087120 A1 Mar. 26, 2015

Related U.S. Application Data

(62) Division of application No. 13/875,361, filed on May 2, 2013.

(51) Int. Cl.
| | |
|---|---|
| *H01L 21/336* | (2006.01) |
| *H01L 29/417* | (2006.01) |
| *H01L 29/161* | (2006.01) |
| *H01L 29/04* | (2006.01) |

(Continued)

(52) U.S. Cl.
CPC ........ *H01L 29/41783* (2013.01); *H01L 29/161* (2013.01); *H01L 29/045* (2013.01); *H01L 29/45* (2013.01); *H01L 29/66545* (2013.01); *H01L 29/6656* (2013.01); *H01L 21/283* (2013.01)

(58) Field of Classification Search
CPC ................. H01L 29/6656; H01L 29/66545; H01L 29/66757; H01L 29/7834; H01L 29/66636
USPC ........... 438/197, 270, 300; 257/288, E21.409
See application file for complete search history.

(56) References Cited

U.S. PATENT DOCUMENTS

| | | |
|---|---|---|
| 6,894,357 B2 | 5/2005 | Guo |
| 7,271,049 B2 | 9/2007 | Gluschenkov et al. |

(Continued)

OTHER PUBLICATIONS

Sun et al., "Impact of Epi Facets on Deep Submicron Elevated Source/Drain MOSFET Characteristics" IEEE Transactions on Electron Devices, vol. 45, No. 6, Jun. 1998, pp. 1377-1380.

(Continued)

*Primary Examiner* — Andy Huynh
(74) *Attorney, Agent, or Firm* — Steven M. Kellner; Yuanmin Cai

(57) ABSTRACT

A semiconductor structure and method of manufacturing the same are provided. The semiconductor device includes epitaxial raised source/drain (RSD) regions formed on the surface of a semiconductor substrate through selective epitaxial growth. In one embodiment, the faceted side portions of the RSD regions are utilized to form cavity regions which may be filled with a dielectric material to form dielectric spacer regions. Spacers may be formed over the dielectric spacer regions. In another embodiment, the faceted side portions may be selectively grown to form air gap spacer regions in the cavity regions. A conformal spacer layer with interior and exterior surfaces may be formed in the cavity region, creating an air gap spacer defined by the interior surfaces of the conformal spacer layer.

20 Claims, 14 Drawing Sheets

(51) Int. Cl.
*H01L 29/45* (2006.01)
*H01L 29/66* (2006.01)
*H01L 21/283* (2006.01)

(56) References Cited

U.S. PATENT DOCUMENTS

| | | | |
|---|---|---|---|
| 7,829,943 | B2 | 11/2010 | Sell |
| 8,877,604 | B2 * | 11/2014 | Adam et al. ............ 438/424 |
| 2007/0202640 | A1 | 8/2007 | Al-Bayati et al. |
| 2011/0042744 | A1 * | 2/2011 | Cheng et al. ............ 257/347 |
| 2011/0260220 | A1 | 10/2011 | Chi et al. |
| 2011/0309416 | A1 | 12/2011 | Yamashita et al. |
| 2012/0193713 | A1 | 8/2012 | Kulkarni et al. |
| 2013/0017654 | A1 | 1/2013 | Huang et al. |

OTHER PUBLICATIONS

Adam et al., "Raised Source/Drain and Gate Portion with Dielectric Spacer or Air Gap Spacer", U.S. Appl. No. 13/875,361, filed May 2, 2013, 37 pages.

* cited by examiner

RAISED SOURCE/DRAIN AND GATE PORTION WITH DIELECTRIC SPACER OR AIR GAP SPACER

CROSS-REFERENCE

The present application is a divisional and claims domestic benefit under 35 U.S.C. §120 of U.S. patent application Ser. No. 13/875,361 filed on May 2, 2013, which is incorporated by reference in its entirety.

BACKGROUND

The present invention relates generally to the fabrication of integrated circuits, and more particularly to a structure and method for fabricating a dielectric spacer and air-gap spacer in a complementary metal-oxide-semiconductor (CMOS) device with epitaxial raised source/drain (RSD) structures.

As integrated circuits become increasingly complex, the need for increased packaging density and reduced device parasitics increases. Conventional nonelevated source/drain (SD) regions have been widely used for sub-0.25 µm CMOS technology, but problems associated with heavily doping the SD regions while simultaneously maintaining shallow extension junctions at the channel regions have led to the increased implementation of epitaxial RSD structures. Epitaxial RSD structures allow for ultra shallow junctions and reduce SD resistance in CMOS devices. However, a side effect of the epitaxial RSD structures is an increased parasitic capacitance between the gate and the RSD regions resulting in decreased transistor radio-frequency (RF) performance in terms of speed and noise. The adverse impact of parasitic capacitance on device performance increases greatly as CMOS technology continues to be downscaled to 22 nm and smaller. Accordingly, it may be desirable to overcome the deficiencies and limitations described hereinabove.

SUMMARY

According to one embodiment of the present invention, a method of forming a semiconductor device with dielectric spacer regions utilizing epitaxial raised source/drain (RSD) regions grown by selective epitaxial growth is provided. A method of forming such a semiconductor device may include forming a gate portion with gate sidewalls on the surface of a semiconductor substrate. Gate spacers having first sidewalls may be formed over the gate sidewalls of the gate portion and the surface of the semiconductor substrate. Epitaxial RSD regions may be formed on the surface of the semiconductor substrate through a selective epitaxial growth process. The RSD regions may have a faceted side portion that contacts the first sidewalls at the surface of the semiconductor substrate. Cavity regions may be formed by this geography defined by the first sidewalls and the faceted side portion of the RSD regions. The cavity regions may be filled with a dielectric material to form dielectric regions. Second spacers, having second sidewalls, may be formed on the first sidewalls and on top of the dielectric regions. In an embodiment, a silicide layer may be formed on the upper surfaces of the RSD regions contacting the second sidewalls.

According to another embodiment of the present invention, a method of forming a semiconductor device with air gap spacer regions utilizing epitaxial raised source/drain (RSD) regions grown by selective epitaxial growth is provided. A method of forming such a semiconductor device may include forming a gate portion with gate sidewalls on the surface of a semiconductor substrate. Gate spacers having first sidewalls may be formed over the gate sidewalls of the gate portion and the surface of the semiconductor substrate. A sacrificial layer may be formed on the surface of the semiconductor substrate contacting the first sidewalls. Second spacers having second sidewalls may be formed on the upper surface of the sacrificial layer and the first sidewalls. The sacrificial layer may be removed to expose a bottom surface of the second spacers and the surface of the semiconductor substrate. Epitaxial RSD regions may be formed on the surface of the semiconductor substrate through a selective epitaxial growth process. The RSD regions may have a faceted side portion that contacts the first sidewalls at the surface of the semiconductor substrate.

In one embodiment, the faceted side portion may contact a portion of the bottom surface of the second spacers, creating air gap regions defined by the first sidewalls, the bottom surface of the second spacers, and the faceted side portion. In another embodiment, the RSD regions may be selectively grown in two layers to form air gap spacer regions defined by the first sidewalls, the bottom surface of the second spacers, and the faceted side portion of the first layer of the RSD regions. In another embodiment, the RSD regions may be selectively grown so that the faceted side portion does not contact the bottom surface of the secondary spacers. In this embodiment, a conformal spacer layer having interior and exterior surfaces may be formed over the second sidewalls, the first sidewalls, and a portion of the faceted side portion. The interior surface of the conformal spacer layer may define the air gap regions.

According to another embodiment, the structure of a semiconductor device with spacers defined by epitaxial RSD regions is provided. In one embodiment, a semiconductor structure is provided having dielectric spacer regions formed by filling cavity regions formed by the faceted portion of the RSD regions with dielectric material. In another embodiment, a structure of a semiconductor device is provided with air gap spacer regions formed by selectively growing the faceted side portions of the RSD regions to contact the bottom surface of second spacers present on the first sidewalls of gate spacers. In another embodiment, a structure of a semiconductor device is provided with air gap spacer regions formed by the interior surfaces of a conformal spacer formed on the second sidewalls of the second spacers, the first sidewalls of the gate spacers, and a portion of the faceted side portion.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
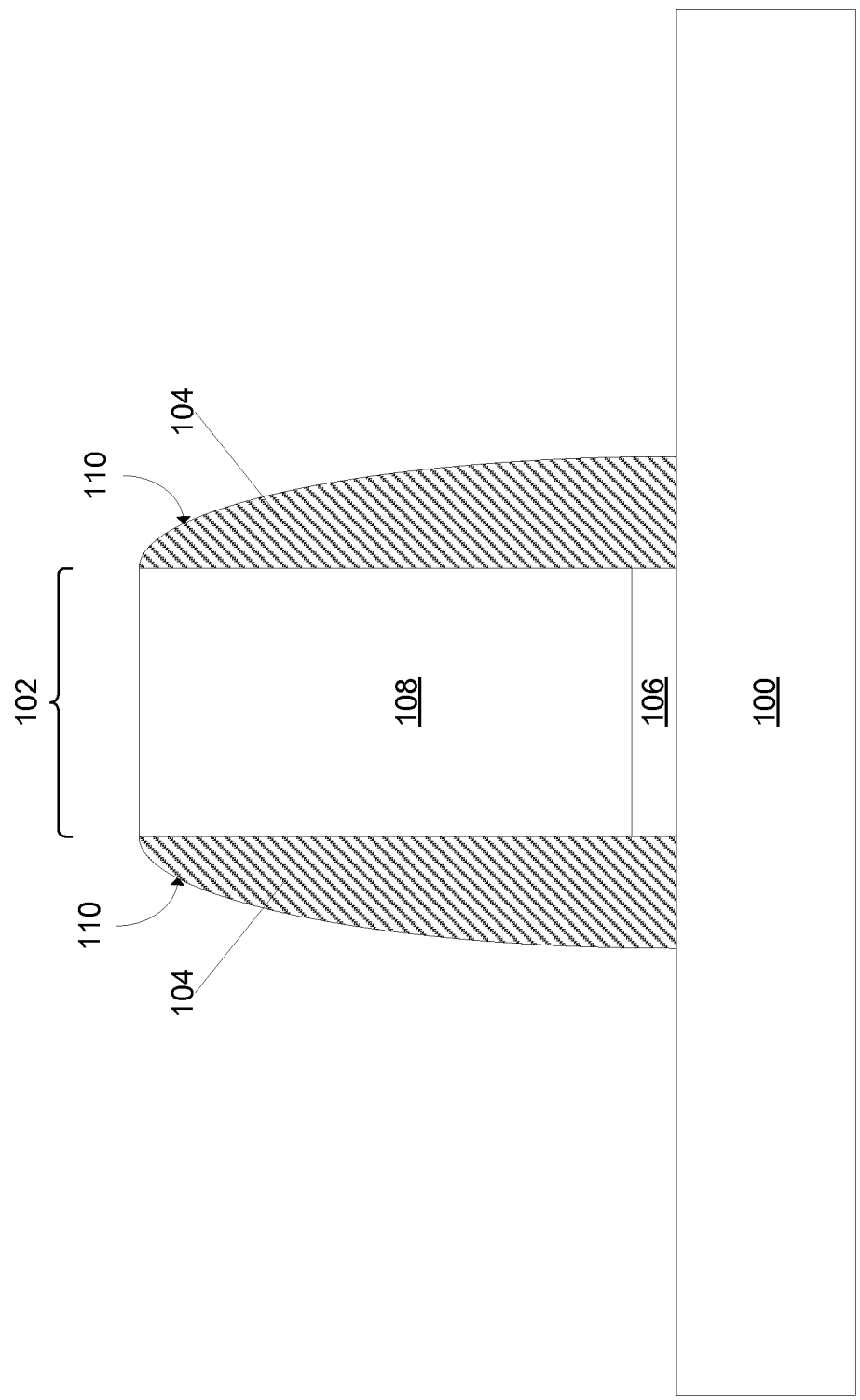
FIG. 1 is a vertical cross-sectional view of a semiconductor structure comprising a semiconductor substrate, a gate portion, and gate spacers having first sidewalls, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

The embodiments of the present invention relate generally to the fabrication of integrated circuits, and more particularly to a structure and method for fabricating a dielectric spacer and air-gap spacer in a complementary metal-oxide-semiconductor (CMOS) device with epitaxial raised source/drain (RSD) structures. A semiconductor device is comprised of an intrinsic semiconductor material that has been doped, i.e., into which a doping agent has been introduced, to turn it into an extrinsic semiconductor having different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A field effect transistor (FET) is a semiconductor device in which output current, i.e., source-drain current, is controlled by the voltage applied to a gate portion. A FET has three terminals: a gate portion, source, and drain. The gate portion is used to control output current, i.e., flow of carriers in the channel, of a semiconductor device through electrical or magnetic fields. The channel region is located between the source and drain of the semiconductor device that becomes conductive when the semiconductor device is turned on. The source region is a doped region, in which majority carriers are flowing into the channel. The drain region is a doped region located on the other side of the channel region, in which carriers are flowing into from the channel region. The term "raised," as used herein to describe a RSD region has an upper surface that is vertically offset and above the upper surface of the semiconductor substrate. A "low-k" material as used herein is a dielectric material with a small dielectric constant relative to silicon dioxide ($SiO_2$), which is 3.9. This number is the ratio of the permittivity of $SiO_2$ divided by the permittivity of a vacuum. An "air gap" as used herein is a volume of a gas that has a dielectric constant of less than 2.0, as measured at 1 atmospheric pressure (atm) at room temperature.

In an embodiment, the positioning of the dielectric spacer region or air gap spacer region between a sidewall of a gate spacer and a lateral surface of the RSD regions reduces the fringe capacitance of the device when compared to similar semiconductor devices. The fringe capacitance is a measurement of the capacitance formed between the gate conductor and the RSD regions, in addition to the capacitance that is formed between the gate portion and the portion of the RSD extensions that extend under the gate spacers.

Typically, a semiconductor device has one or more dielectric spacers formed on the vertical surfaces of the gate portion, separating the gate portion from the RSD regions. These dielectric spacers typically have a dielectric constant of 2.25 or greater, ranging from approximately 3.9 to approximately 7.5, as measured at 1 atm at room temperature. The relatively high dielectric constant of the dielectric spacers creates a high capacitance between the gate conductor and the RSD regions. In comparison, and in some embodiments, by utilizing epitaxial RSD regions and filling the space created between gate spacers and said epitaxial RSD regions with a dielectric material, the present disclosure may help reduce the parasitic capacitance between the RSD regions and gate portion, therefore reducing fringe capacitance. Likewise, and in another embodiment, the fringe capacitance may be reduced by forming an air gap spacer region between the gate spacers and epitaxial RSD regions. For example, in comparison to conventional FET, the structures disclosed herein, in which epitaxial RSDs are utilized to form spacer areas, provide approximately an 80% decrease in fringe capacitance.

One method of utilizing epitaxial RSD regions to form dielectric spacer regions is described in detail below by referring to the accompanying drawings in FIGS. 1-5, in accordance with an illustrative embodiment. In the present embodiment, epitaxial RSD regions may be formed on the surface of the substrate have at least one faceted side portion. The resulting cavity formed between the at least one faceted side portion and the gate spacers may then be filled with a dielectric material. This dielectric material may then be covered with a protective spacer to protect it during further processing steps.

Referring to FIG. 1, a semiconductor device according to one exemplary embodiment may include a semiconductor substrate 100, a gate portion 102, and gate spacers 104. The gate portion 102 may be processed to provide a p-type or n-type field effect transistor. Although one gate portion 102 is depicted, it is noted that the present disclosure is equally applicable to any number of gate portions and any number of semiconductor devices.

In one embodiment, the semiconductor substrate 100 may be a bulk semiconductor substrate, as depicted in FIG. 1. In one example, the bulk semiconductor may be a silicon (Si)-containing material. Illustrative examples of Si-containing materials suitable for the bulk semiconductor substrate include, but are not limited to, Si, SiGe, SiGeC, Si:C, polysilicon, epitaxial Si, amorphous Si, and multi-layers thereof. Although Si is the predominately used semiconductor material in wafer fabrication, other materials may be used, such as, but not limited to, germanium, gallium arsenide, gallium nitride, cadmium telluride, and zinc sellenide.

Although not depicted in FIG. 1, the semiconductor substrate 100 may also be a semiconductor on insulator (SOI) substrate. SOI substrates are typically composed of at least a first semiconductor layer overlying a dielectric layer, referred to as a buried dielectric layer. A second semiconductor layer may be present underlying the dielectric layer. The first semiconductor layer and the second semiconductor layer may comprise any of the following materials, including, but not limited to: Si, strained Si, Si:C, SiGe, SiGeC, Si alloys, Ge, Ge alloys, GaAs, InAs, and InP, or any combination thereof. The dielectric layer that is present underlying the first semiconductor layer may be formed by implanting a high-energy dopant into the semiconductor substrate 100, and then annealing the structure to form a buried oxide layer. In another embodiment, the dielectric layer may be deposited or grown prior to the formation of the first semiconductor layer. In yet another embodiment, the SOI substrate may be formed using wafer-bonding techniques, where a bonded wafer pair is formed utilizing glue, adhesive polymer, or direct bonding.

In a preferred embodiment, the gate portion 102 may include at least one gate dielectric 106 and at least one gate conductor 108. The gate portion 102 may be formed using deposition, photolithography, and selective etch processes. A gate layer stack is formed on the surface of the semiconductor substrate 100 by depositing at least one gate dielectric layer 106 on the semiconductor substrate 100, and then depositing at least one gate conductor layer 108 on the at least one gate dielectric layer 106. The gate layer stack is then patterned and etched to provide the gate portion 102. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process. In some embodiments, a sacrificial gate structure may be formed and the gate portion 102 may be formed later by a replacement gate process.

Although not depicted in FIG. 1, in an embodiment, a dielectric cap may be formed on the surface of the gate portion 102. The dielectric cap may be formed by first depositing a dielectric hardmask material, such as SiN or $SiO_2$, atop a layer of the at least one gate conductor layer 108 and then applying a photoresist pattern to the hardmask material using a lithography process step. The photoresist pattern is then transferred into the hardmask material using a dry etch process forming the dielectric cap. Next, the photoresist pattern is removed and the dielectric cap pattern is transferred into the at least one gate conductor layer 108 during a selective etching process. In addition, other suitable patterning techniques such as sidewall imaging transfer may also be used for patterning the gate portion 102.

In one embodiment, the at least one gate dielectric layer 106 may be an oxide, nitride, or oxynitride of silicon. In another embodiment the at least one gate dielectric layer 106 may be composed of a high-k dielectric material. A high-k dielectric material has a dielectric constant higher than the dielectric constant of silicon dioxide ($SiO_2$). In one embodiment, a high-k dielectric material has dielectric constant that is greater than 4.0. High-k dielectric materials suitable for the at least one gate dielectric layer 106 may include, but are not limited to, hafnium oxides, hafnium silicates, titanium oxides, barium-strontium-titanates (BSTs), and lead-zirconate-titanates (PZTs). The at least one gate dielectric layer 106 may be formed using any of several deposition methods and physical vapor deposition methods. In one embodiment, the at least one gate dielectric layer 106 has a thickness ranging from approximately 10 angstroms to approximately 200 angstroms.

The at least one gate conductor layer 108 may be composed of conductive materials including, but not limited to, metals, metal alloys, metal nitrides, metal silicides, as well as laminates thereof and composites thereof. In one embodiment, the at least one gate conductor layer 108 may be any conductive material including, but not limited to: W, Ni, Ti, Mo, Ta, Cu, Pt, Ag, Au, Ru, Ir, Rh, Re, and alloys that include at least one of the aforementioned materials. The at least one gate conductor layer 108 may also comprise doped polysilicon and/or polysilicon-germanium alloy materials having a dopant concentration ranging from approximately 1E18 to approximately 1E22 dopant atoms per cubic centimeter. The at least one gate conductor layer 108 may also comprise polycide materials of doped polysilicon/metal silicide stack materials.

The at least one gate conductor layer 108 may be formed using a deposition method including, but not limited to, salicide methods, atomic layer deposition methods, chemical vapor deposition methods, and physical vapor deposition methods, such as, but not limited to, evaporative methods and sputtering methods. Although the at least one gate conductor layer 108 is depicted in the supplied figures as being a single layer, embodiments may include at least one gate conductor layer 108 that is multi-layered containing more than one conductive material. The thickness of the at least one gate conductor layer 108 my range from approximately 10 nm to approximately 200 nm. In one embodiment, the thickness of the at least one gate conductor layer 108 may range from approximately 30 nm to approximately 150 nm. In another embodiment, the thickness of the at least one gate portion 102 may range from approximately 40 nm to approximately 150 nm.

In some embodiments, the gate portion 102 is a dummy gate that will be replaced in later processing by gate dielectric and gate conductor. For embodiments in which a dummy gate is used, the gate dielectric 106 may be oxide, nitride, or oxynitride. In addition, the gate conductor layer 108 may be amorphous silicon or polycrystalline silicon.

According to an embodiment, gate spacers 104 having first sidewalls 110 may be formed on the exposed sidewalls of the gate portion 102. The gate spacers 104 may be comprised of an insulator such as a nitride, oxide, oxynitride, and/or any combination thereof. In one embodiment, oxide inner spacers are formed and nitride outer spacers are formed. The gate spacers 104 may be formed by well known methods of deposition such as, but not limited to chemical vapor deposition (CVD), plasma-assisted CVD, metal organic chemical vapor deposition (MOCVD), atomic layer deposition (ALD), evaporation, reactive sputtering, chemical solution deposition, and other like processes. After deposition, the gate spacers 104 may also undergo an etching process such as, but not limited to reactive ion etching (RIE), isotropic or anisotropic etching, or chemical mechanical planarization (CMP). In one embodiment, the gate spacers 104 may have a width of approximately 3 nm to approximately 20 nm at their widest point.

Figure 2:
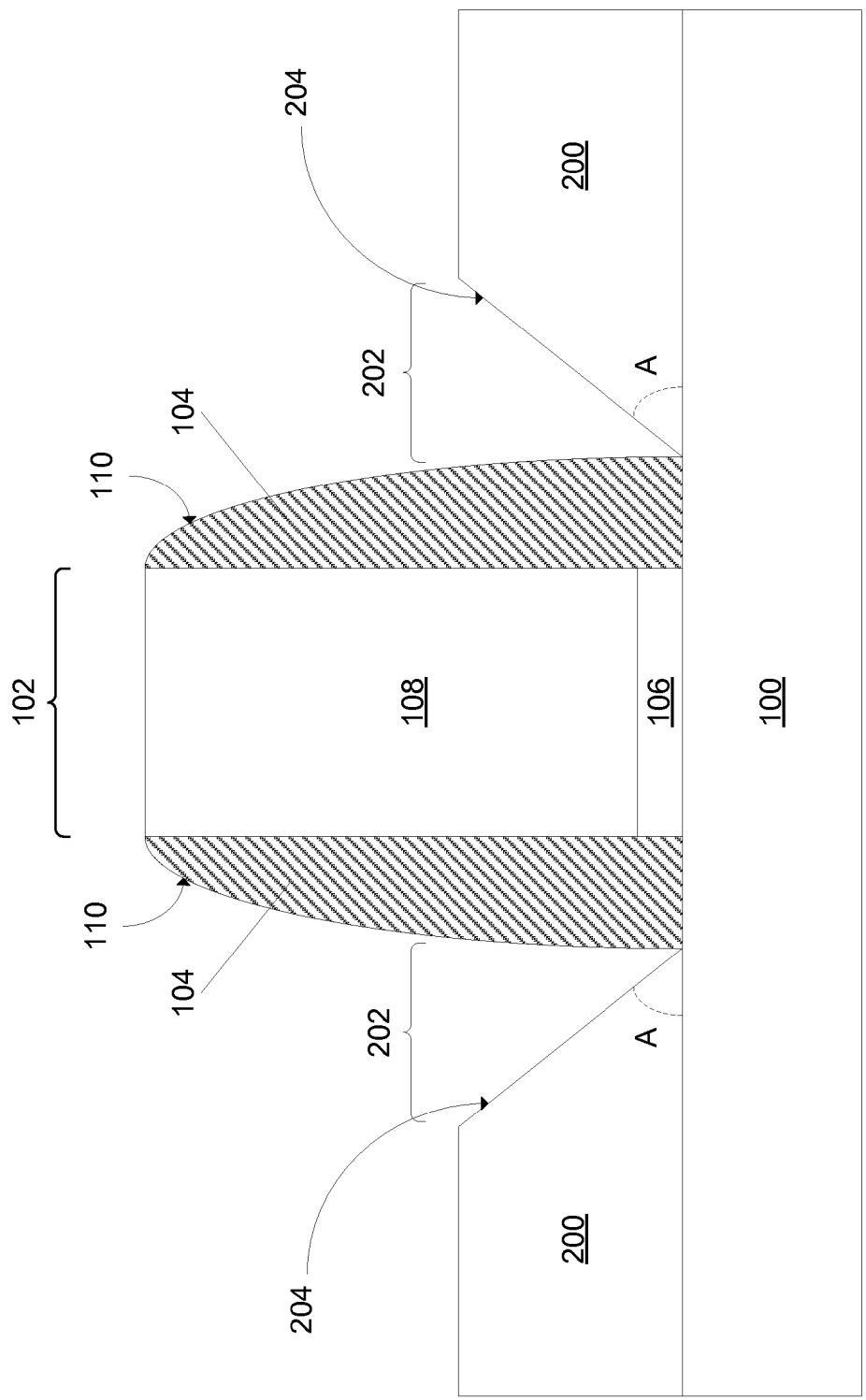
FIG. 2 is a vertical cross-sectional view of the semiconductor structure shown in FIG. 1 after epitaxial raised source/drain (RSD) regions having a faceted side portion have been formed on the surface of the semiconductor substrate creating cavity regions, according to an embodiment of the present invention.

Referring now to FIG. 2, according to an embodiment of the present invention, RSD regions 200 may be formed adjacent to the gate spacers 104 by a selective epitaxial growth process. As used herein, the terms "epitaxially formed," "epitaxial growth," and/or "epitaxial deposition" mean the growth of a semiconductor material on a deposition surface of a semiconductor substrate 100. When the chemical reactants used in the epitaxial growth process are controlled and the system parameters are set correctly, the depositing atoms arrive at the surface of the semiconductor substrate 100 with sufficient energy to move around on the surface and orient themselves to the crystal arrangement of the atoms of the deposition surface. The RSD regions 200 may be formed by the selective growth of silicon. The silicon may be single crystal, polysilicon, or amorphous. The RSD regions 200 may also be formed by the selective growth of germanium. The germanium may be single crystal, polycrystalline, or amorphous. In another embodiment, the RSD regions 200 may be composed of SiGe.

During the selective epitaxial growth process, process parameters may be selected such that a self-limiting deposition behavior may be obtained, at least in one crystallographic orientation or axis. For example, according to an embodiment of the present invention, (111) crystal planes or any physically equivalent planes have substantially smaller epitaxial growth rate compared to (100) crystal planes, thereby providing a self-limiting deposition behavior once the deposited material forms a geometric configuration, in which (111) crystallographic planes are the only outer surface areas which may thus substantially completely prevent a further deposition of any further material.

In accordance with an embodiment of the present invention, the RSD regions 200 may have a faceted side portion 204 having (111) crystal orientation. In other words, the RSD regions 200 may have a side normal to the surface of the semiconductor substrate 100 that rises from the surface at an angle. Consequently, once the desirable geometrical configuration is achieved for the RSD regions 200, the deposition process may be stopped on the basis of the self-limiting behavior. In an embodiment, the RSD regions 200 may be selectively grown to cause the faceted side portion 204 to rise at an angle A from approximately 20 degrees to approximately 75 degrees relative to a bottom surface of the RSD regions 200. The angle of the faceted side portion 204 forms a cavity region 202 defined by the faceted side portion 204, and the first sidewalls 110.

In an embodiment in which the RSD regions 200 are composed of SiGe, the SiGe layer may be formed by a selective epitaxial process using a combination of: a Si containing gas, such as silane ($SiH_4$), dichlorosilane ($SiH_2Cl_2$), disilane ($Si_2H_6$), trisilane ($Si_3H_8$) or tetrasilane ($Si_4H_{10}$); a germanium containing gas, such as germane ($GeH_4$) or digermane ($Ge_2H_6$); a carrier gas such as nitrogen, hydrogen, or argon; and an optional etchant gas such as hydrogen chloride (HCl) or chlorine ($Cl_2$), at a temperature ranging preferably from approximately 450° C. to approximately 900° C. The SiGe layer may have a Ge concentration of approximately 15% to approximately 100%, and preferably from approximately 20% to approximately 60%.

In one embodiment, at least one of the RSD regions 200 is in-situ doped with a p-type conductivity dopant during the selective epitaxial growth process. P-type semiconductor devices (PFETs) are typically produced by doping the SD regions with a p-type dopant comprising elements from group III of the Periodic Table of Elements, including boron, aluminum, gallium, indium, or alloys thereof. In one embodiment, at least one of the RSD regions 200 may have a p-type dopant in a concentration ranging from approximately $1 \times 10^{19}$ atoms/cm$^3$ to approximately $5 \times 10^{21}$ atoms/cm$^3$. In another embodiment, the p-type conductivity dopant may be introduced to at least one of the RSD regions 200 using ion implantations following the selective epitaxial growth process that is used to form the RSD regions 200.

In one embodiment, at least one of the RSD regions 200 is in-situ doped with an n-type conductivity dopant during the selective epitaxial growth process. N-type semiconductor devices (NFETs) are typically produced by doping the SD regions with a dopant comprising elements from group V of the Periodic Table of Elements, including phosphorus, antimony, arsenic, or alloys thereof. In one embodiment, at least one of the RSD regions 200 may have a n-type dopant in a concentration ranging from approximately $1 \times 10^{19}$ atoms/cm$^3$ to approximately $5 \times 10^{21}$ atoms/cm$^3$. In another embodiment, the n-type conductivity dopant may be introduced to at least one of the RSD regions 200 using ion implantations following the selective epitaxial growth process that is used to form the RSD regions 200.

In one embodiment, the dopant of the RSD regions 200 is activated using a thermal annealing process. The thermal annealing process may be provided by a furnace anneal, rapid thermal anneal, or laser anneal. In one example, the temperature of the annealing process ranges from approximately 900° C. to approximately 1400° C. In other examples, the temperature of the annealing process ranges from approximately 1000° C. to approximately 1300° C. The time period of the annealing processes ranges from approximately 10 ms to approximately 60 s. In another embodiment, the time period ranges from approximately 10 ms to approximately 10 s.

Figure 3:
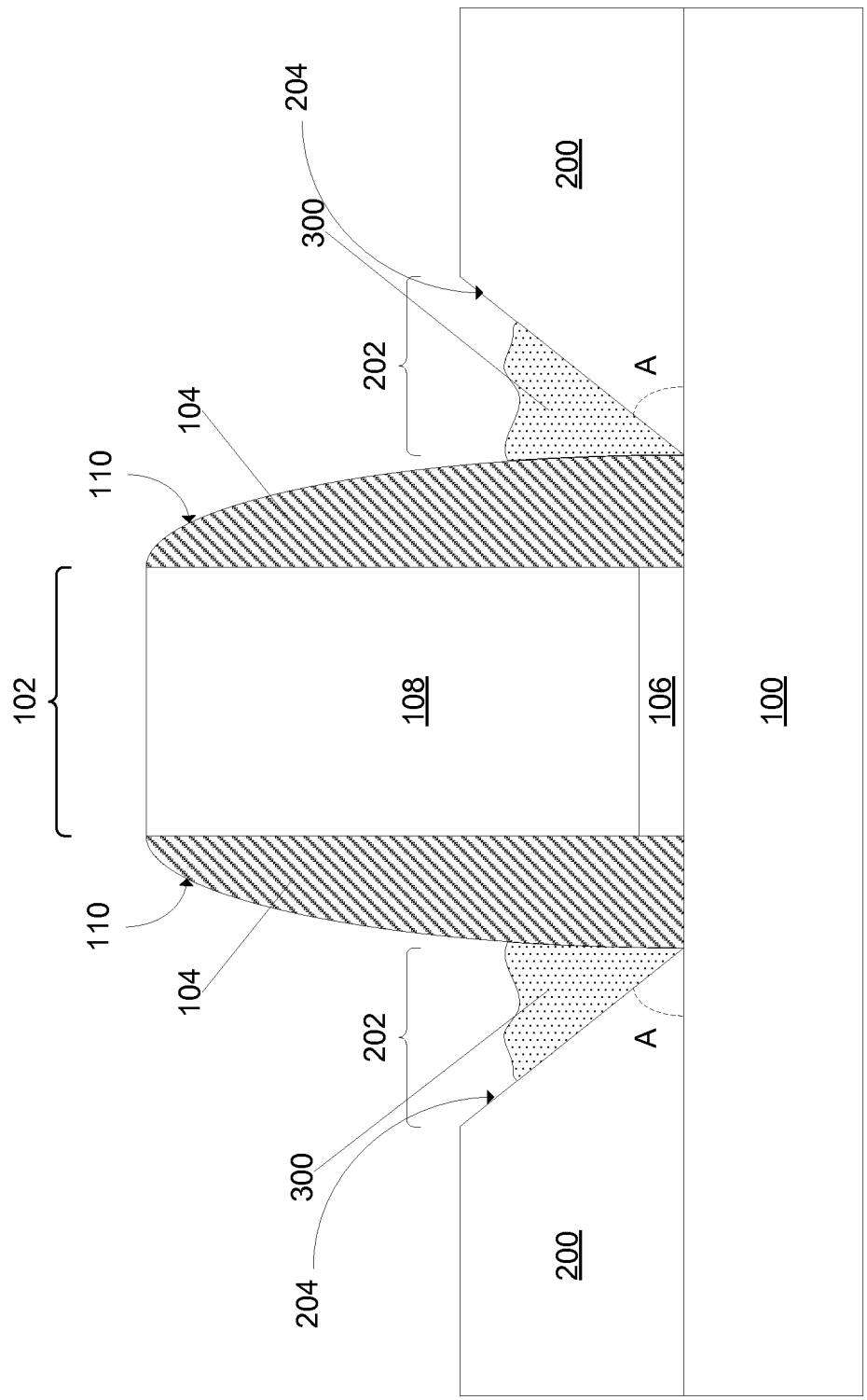
FIG. 3 is a vertical cross-sectional view of the semiconductor structure shown in FIG. 2 after a dielectric material has been deposited in the cavity regions between the first sidewalls and the epitaxial RSD regions, according to an embodiment of the present invention.

Referring now to FIG. 3, the cavity regions 202 may be filled with a dielectric material 300. In one embodiment, the dielectric material 300 may by comprised of a low-k dielectric material including, but not limited to, an oxide, nitride, oxynitride, and/or silicates including metal silicates, aluminates, titanates, and nitrides. In an embodiment in which the dielectric material 300 is a low-k dielectric material comprising an oxide, the oxide may selected from the group including, but not limited to, $SiO_2$, $HfO_2$, $ZrO_2$, $Al_2O_3$, $TiO_2$, La$_2$O$_3$, SrTiO$_3$, LaAlO$_3$, Y$_2$O$_3$, and mixtures thereof. In another embodiment, the dielectric material 300 may be a low-k dielectric material comprising of a nitride, such as silicon nitride.

In another embodiment, the dielectric material 300 may be comprised of a material with a dielectric constant ranging from approximately 4.0 to approximately 7.0. In such an embodiment, the dielectric material 300 may include silicon oxide, silicon oxynitride, and/or other material with a dielectric constant ranging from approximately 4.0 to approximately 7.0, including but not limited to: boron nitride, carbon doped silicon oxide, fluorine doped silicon oxide, boron carbon nitride, hydrogen silsesquioxane polymer (HSQ), methyl silsesquioxane polymer (MSQ), polyphenylene oligomer, methyl doped silica, SiO$_x$(CH$_3$)$_y$, SiC$_x$O$_y$H$_y$, organosilicate glass (SiCOH), porous SiCOH, and mixtures thereof.

The thickness of the dielectric material 300 may vary, but typically the dielectric material 300 has a thickness ranging from approximately 5 nm to approximately 30 nm. In another embodiment, the dielectric material 300 has a thickness ranging from approximately 10 nm to approximately 20 nm. The dielectric material 300 may be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition, and other like processes. In one embodiment, the dielectric material 300 is deposited by, for example, any of the above methods, and then etched to a preferable thickness by, for example, by RIE or chemical mechanical planarization (CMP) followed by RIE.

Figure 4:
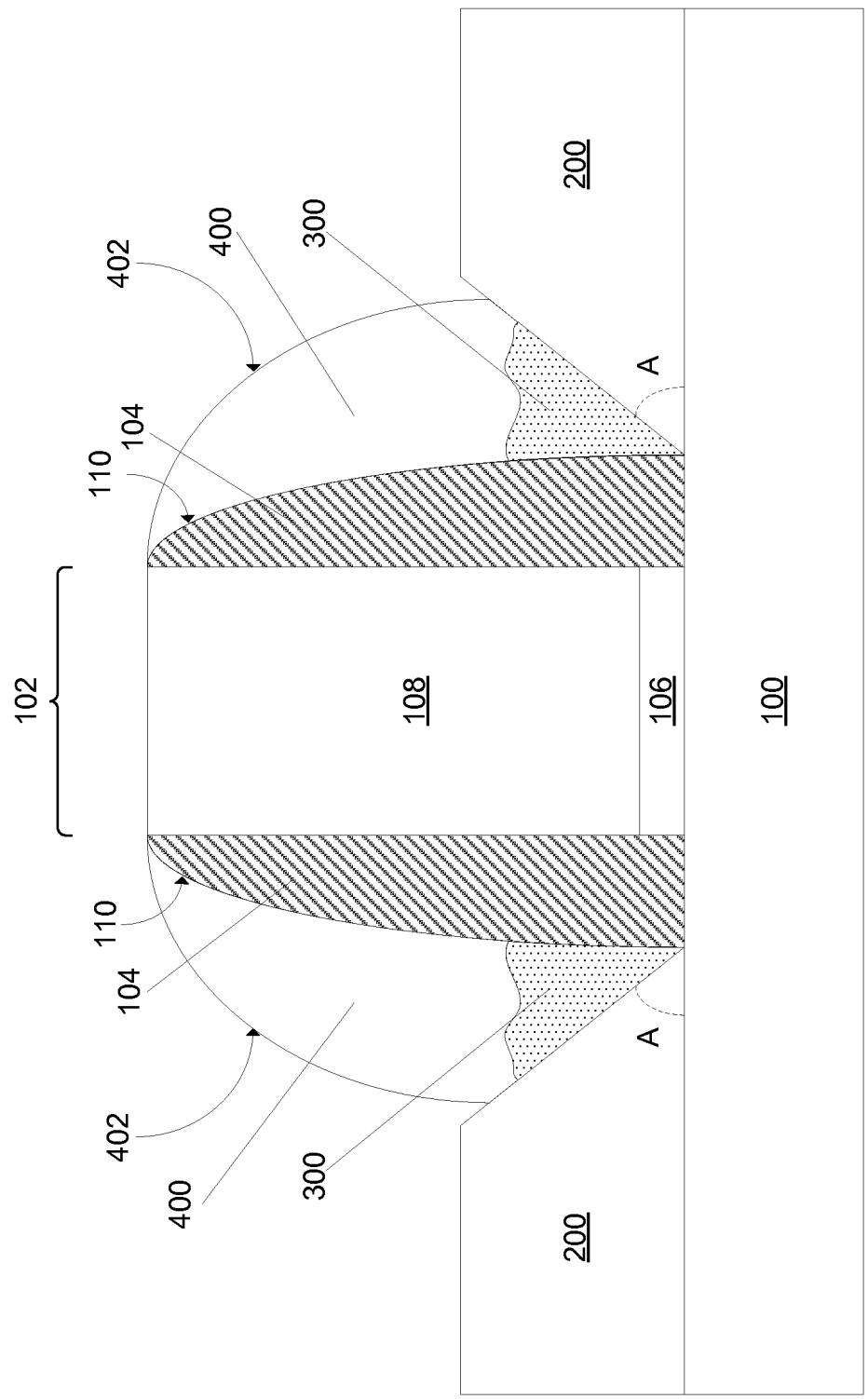
FIG. 4 is a vertical cross-sectional view of the semiconductor structure shown in FIG. 3 after second spacers are formed over the dielectric material creating dielectric spacers, according to an embodiment of the present invention.

Referring now to FIG. 4, second spacers 400 having second sidewalls 402 may be formed on the first sidewalls 110 and upper surface of the dielectric material 300. The second spacers 400 may be comprised of an insulator such as a nitride, oxide, oxynitride, and/or any combination thereof. The second spacers 400 may be formed by well known methods of deposition such as, but not limited to CVD, plasma-assisted CVD, metal organic chemical vapor deposition (MOCVD), atomic layer deposition (ALD), evaporation, reactive sputtering, chemical solution deposition, and other like processes. After deposition, the second spacers 400 may also undergo an etching process such as, but not limited to reactive ion etching (RIE), isotropic or anisotropic etching, or chemical mechanical planarization (CMP). In one embodiment, the second spacers 400 may have a width of approximately 3 nm to approximately 30 nm at their widest point. The second spacers 400 provide a protective cap to shield the dielectric material 300 from damage during processing steps further down the line.

Figure 5:
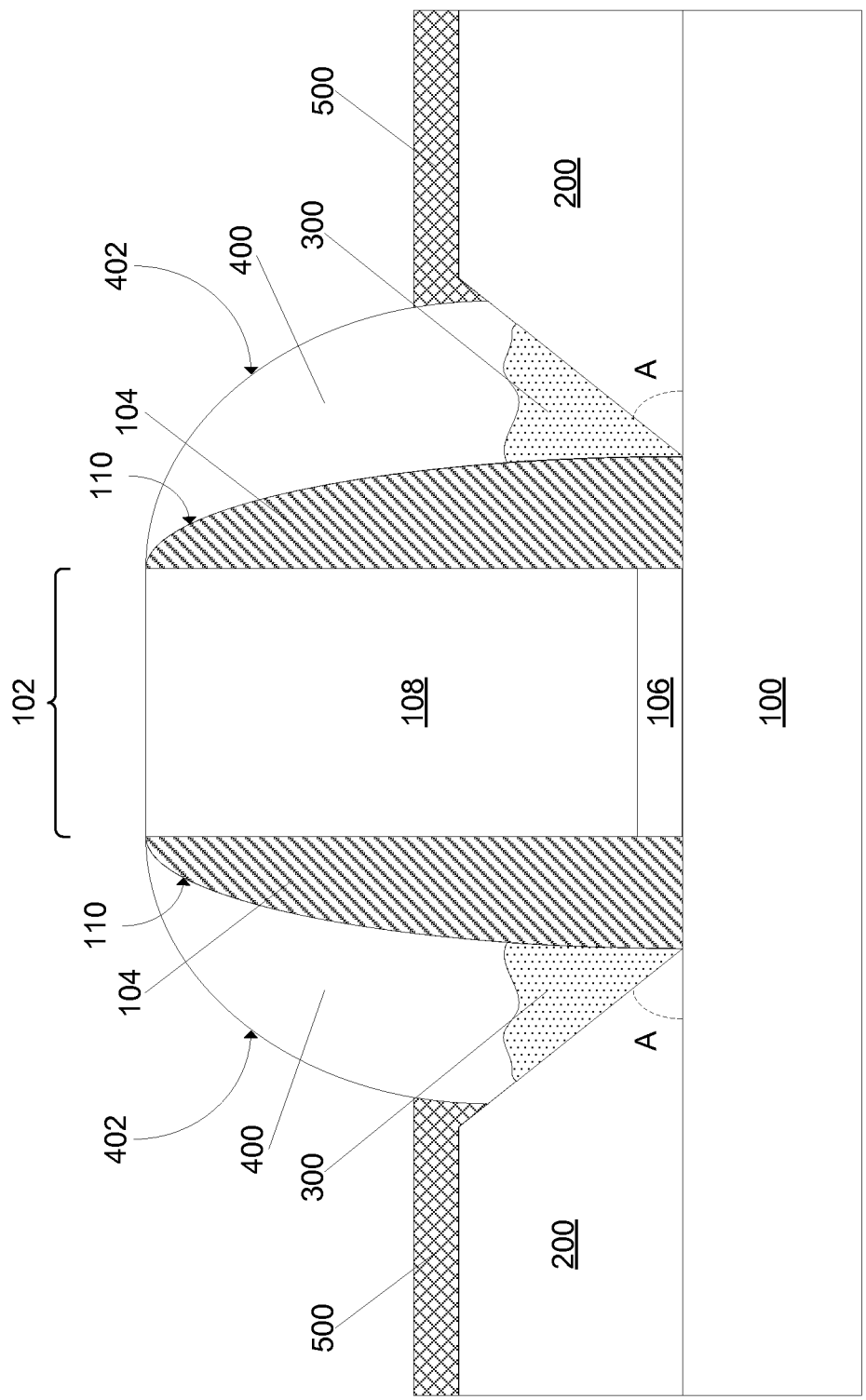
FIG. 5 is a vertical cross-sectional view of the semiconductor structure shown in FIG. 4 after silicide has been formed on the surface of the epitaxial RSD regions, according to an embodiment of the present invention.

Referring now to FIG. 5, in one embodiment, a silicide 500 may be formed on the surface of the RSD regions 200 contacting the second sidewalls 402. The silicide 500 may be formed by depositing a refractory metal such as, but not limited to, Ni or Ti onto the surface of the RSD regions 200, which contain Si. Following deposition, the structure may then be subjected to an annealing step, including, but not limited to, rapid thermal annealing. During the annealing step, the deposited metal reacts with Si forming a metal silicide. Examples of silicides suitable for the silicide 500 include, but are not limited to, nickel silicide, nickel platinum silicide, cobalt silicide, tantalum silicide, and titanium silicide.

Figure 6:
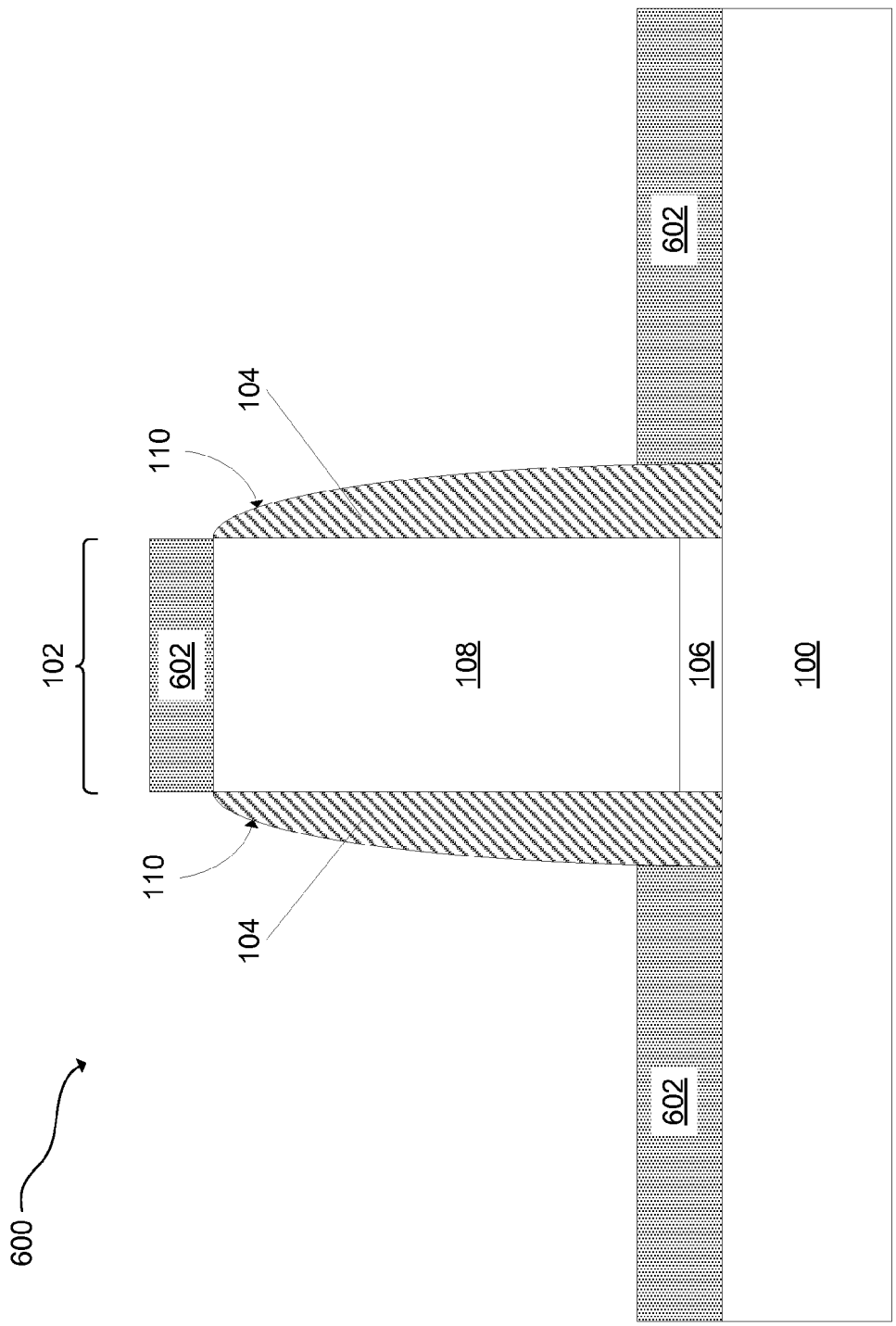
FIG. 6 is a vertical cross-sectional view of the semiconductor structure shown in FIG. 1 according to another embodiment of the present invention after a sacrificial layer has been formed on the surfaces of the semiconductor substrate and gate portion.
Figure 7:
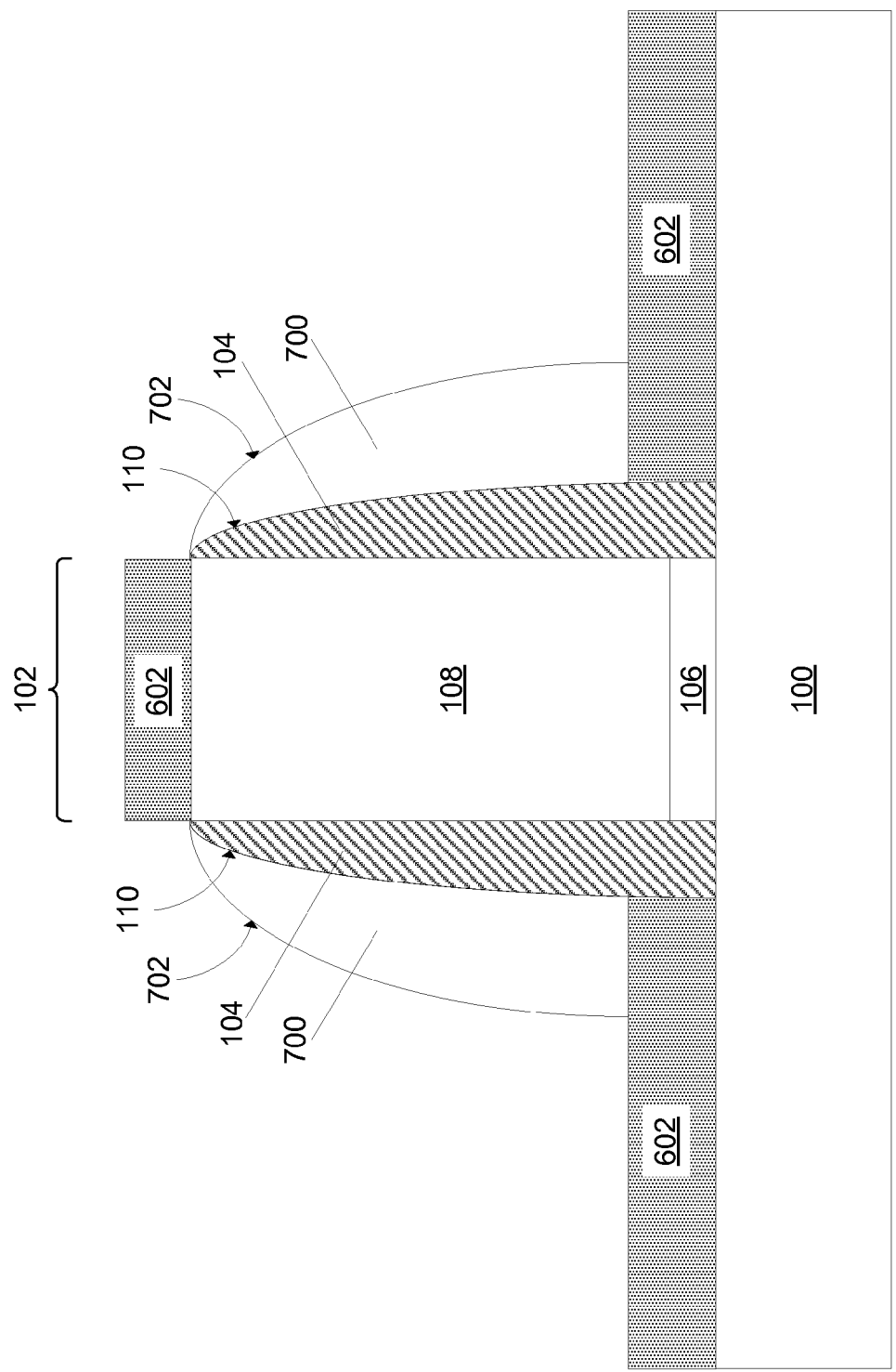
FIG. 7 is a vertical cross-sectional view of the semiconductor structure shown in FIG. 6 after second spacers have been formed on the surface of the sacrificial layer present on the surface of the semiconductor substrate, according to an embodiment of the present invention.
Figure 8:
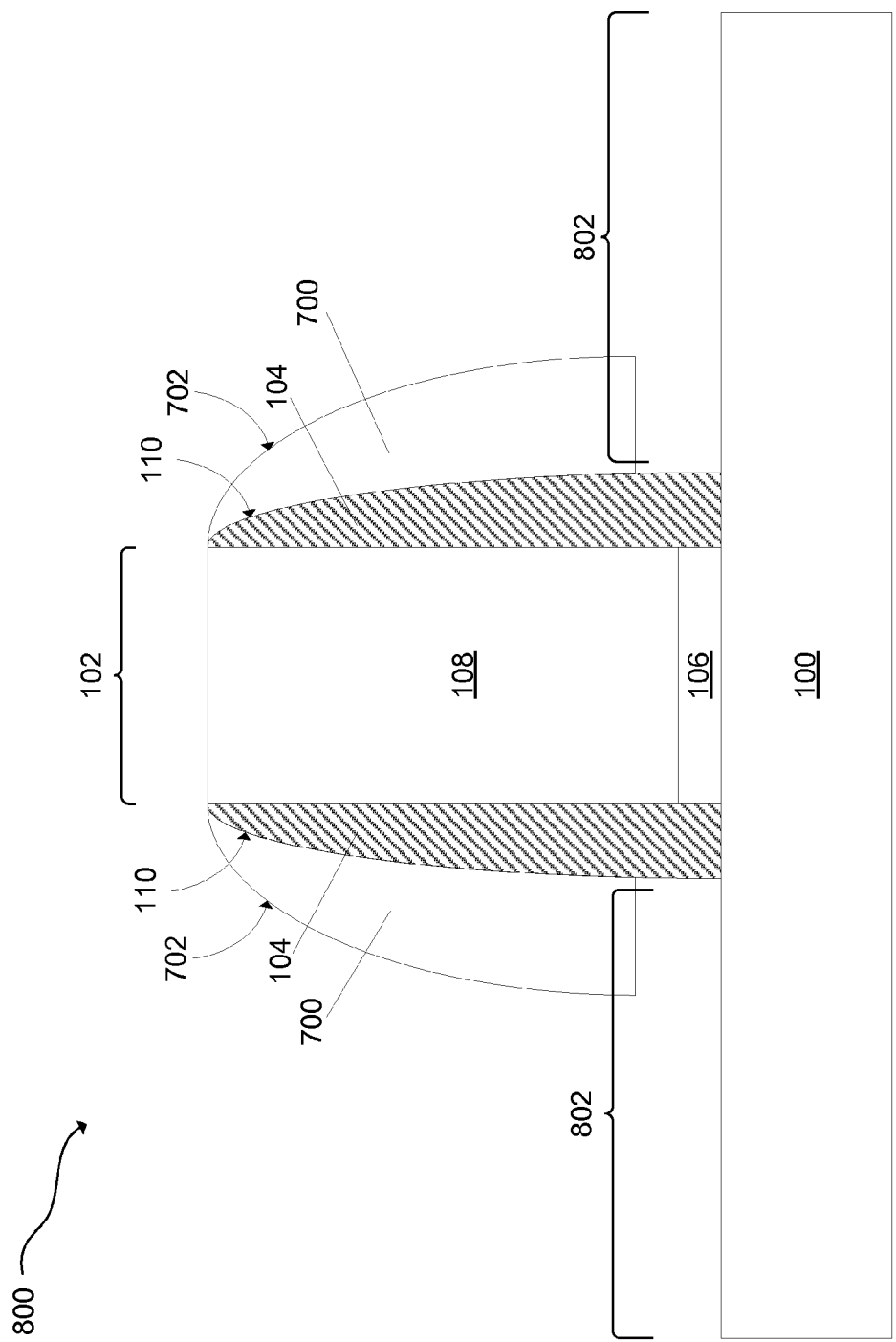
FIG. 8 is a vertical cross-sectional view of the semiconductor structure shown in FIG. 7 after the sacrificial layer has been removed, according to an embodiment of the present invention.

A method of utilizing epitaxial RSD regions to form air gap spacer regions is described in detail below by referring to the accompanying drawings in FIGS. 6-11C in accordance with illustrative embodiments. FIGS. 6-8 are illustrative of the preliminary steps shared by various embodiments of the present invention that are subsequently illustrated in FIGS. 9-11C. In the following embodiments, epitaxial RSD regions may be formed on the surface of the substrate having at least one faceted side portion. The resulting air space between the at least one faceted side portion, the gate spacers, and the second spacers may be sealed off to form air gap spacer regions.

Referring now to FIG. 6, a structure 600 is shown. The structure 600 may include the semiconductor substrate 100, the gate portion 102, the gate spacers 104, the at least one gate dielectric layer 106, the at least one gate conductor layer 108, and the first sidewalls 110 illustrated in FIG. 1. The fabrication steps and techniques detailed above with reference to FIG. 1 may be used to complete structure 600.

In an embodiment, a sacrificial layer 602 may be formed on the surfaces of the semiconductor substrate 100 and the gate portion 102. By "sacrificial" it is meant that this material layer is not present in the final structure of the semiconductor device, although it is employed to contribute to definition of the geometry of the subsequently formed air gap spacer region. The sacrificial layer 602 may be a dielectric material, such as an oxide, nitride, or oxynitride material. In one embodiment, in which the sacrificial layer material is an oxide, the sacrificial layer 602 is composed of silicon oxide. In another embodiment, in which the sacrificial layer material is a nitride, the sacrificial layer 602 is silicon nitride. It is noted that the above compositions are provided for illustrative purposes only. The sacrificial layer 602 may be any material that can be removed selectively to the semiconductor substrate 100, the gate portion 102, the gate spacers 104, the at least one gate dielectric layer 106, the at least one gate conductor layer 108, and the second spacers 700 (shown in FIG. 7).

The sacrificial layer 602 may be deposited, for example, using CVD. CVD is a deposition process in which a deposition species is formed as a result of a chemical reaction between gaseous reactants at greater than room temperature, for example from approximately 25° C. to approximately 900° C. The solid product of the react is deposited on the surface on which a film, coating, or layer of the solid product is to be formed. Variations of CVD that may be used to form the sacrificial layer 602 include, but are not limited to: atmospheric pressure CVD (APCVD), low pressure CVD (LPCVD), plasma enhanced CVD (EPCVD), metal-organic CVD (MOCVD), and combinations thereof. Other deposition methods that are suitable for depositing the sacrificial layer 602 include, but are not limited to: spinning from solution, chemical sputter deposition, reactive sputter deposition, ion-beam deposition, and evaporation.

In one embodiment, high-density plasma CVD (HDP-CVD) may be used to deposit the sacrificial layer 602 comprising a high density plasma oxide (HDP oxide). HDP-CVD can be used to deposit a thicker film on horizontal surfaces of the semiconductor substrate 100 and gate portion 102 than on the first sidewalls 110. For example, HDP-CVD may result in a 3:1 anisotropic ratio of deposition; the sacrificial layer 602 may have a thickness of approximately 24 nm on the horizontal surfaces of structure 600 and a thickness of approximately 8 nm on any vertical sidewalls present in structure 600. A subsequent etch back of 10 nm using RIE will remove the sacrificial layer 602 from the sidewalls and leave approximately 14 nm on the horizontal surfaces of the semiconductor substrate 100.

Referring now to FIG. 7, second spacers 700 having second sidewalls 702 may be formed on the surface of the sacrificial layer 602 and the first sidewalls 110. In an embodiment, the second spacers 700 may be comprised of the same materials as the second spacers 400 and formed in using the same processes and techniques described above in forming the second spacers 400 in reference to FIG. 4. In one embodiment, the second spacers 700 may have a width of approximately 3 nm to approximately 20 nm at their widest point.

Referring now to FIG. 8, a structure 800 is shown. The sacrificial layer 602 (shown in FIG. 7) may be removed, for example, by an etching process to form open regions 802. In one embodiment, the sacrificial layer 602 (shown in FIG. 7) may be removed by an etching process that is selective to the sacrificial layer 602 (shown in FIG. 7) such as an isotropic wet or dry etch process. In an embodiment in which the sacrificial layer 602 (shown in FIG. 7) is an oxide, the etching process is performed with an aqueous solution containing hydrofluoric acid (HF). Other examples of etching that can be used include chemical dry etching and plasma etching.

Figure 9:
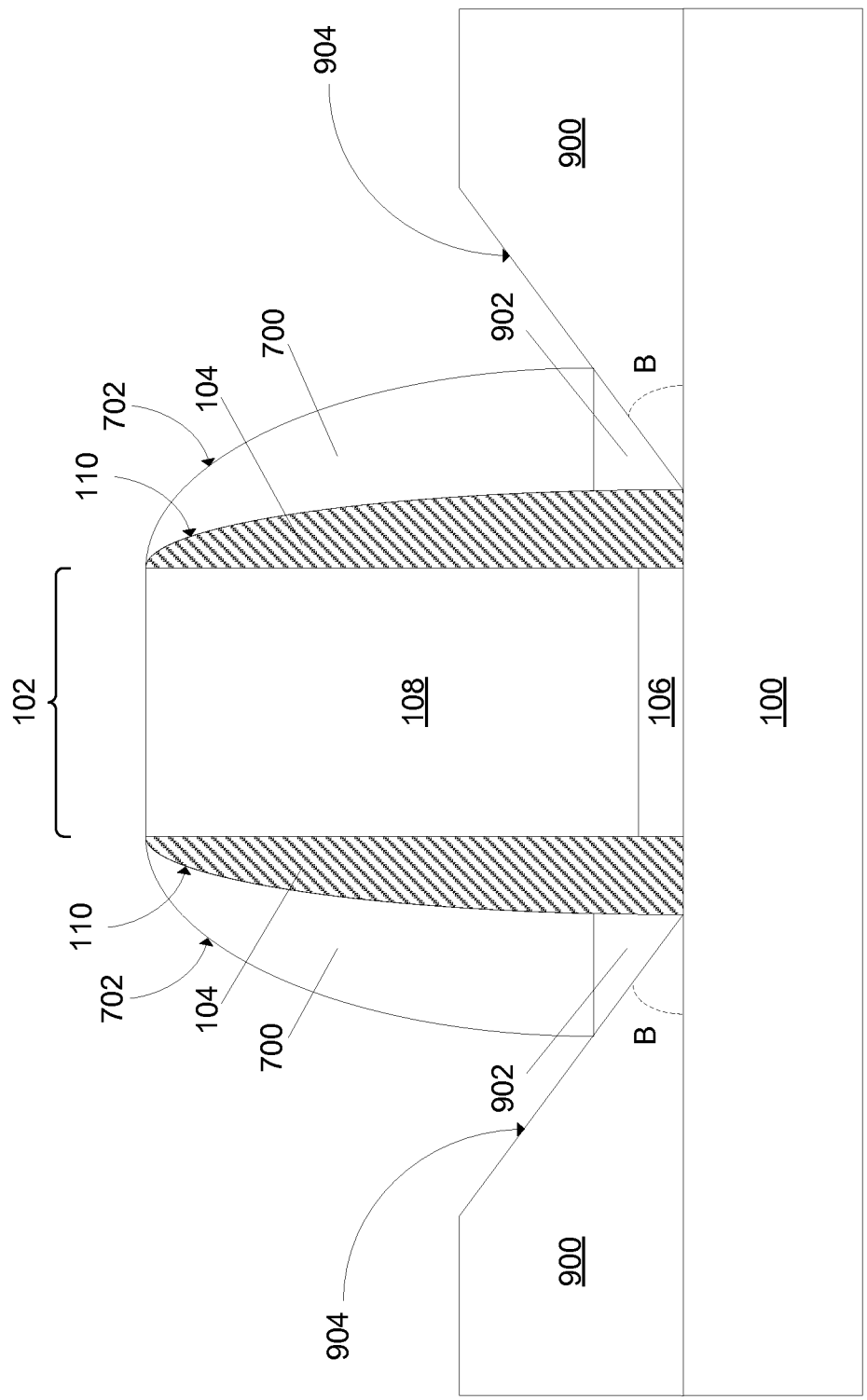
FIG. 9 is a vertical cross-sectional view of the semiconductor structure shown in FIG. 8 after epitaxial RSD regions having a faceted side portion have been formed on the surface of the semiconductor substrate creating air-gap spacer regions, according to an embodiment of the present invention.

Referring now to FIG. 9, in one embodiment, RSD regions 900 may be formed on the surface of the semiconductor substrate 100 in the open regions 802 of structure 800 (shown in FIG. 8). The RSD regions 900 may be comprised of the same materials as the RSD regions 200 and formed in using the same processes and techniques described above in forming the RSD regions 200 in reference to FIG. 2. The RSD regions 900 may contact the first spacers 110 at the surface of the semiconductor substrate 100 and may have a faceted side portion 904 that rises in a direction normal to the surface of the semiconductor substrate 100 at an angle B from approximately 30 degrees to approximately 75 degrees relative to a bottom surface of the RSD regions 900 to contact at least a portion of the bottom surfaces of the second spacers 700. The spaces between the first sidewalls 110, the faceted side portions 904, and the bottoms of the second spacers 700 are geometrically sealed off, thereby creating air gap spacer regions 902.

Figure 10A:
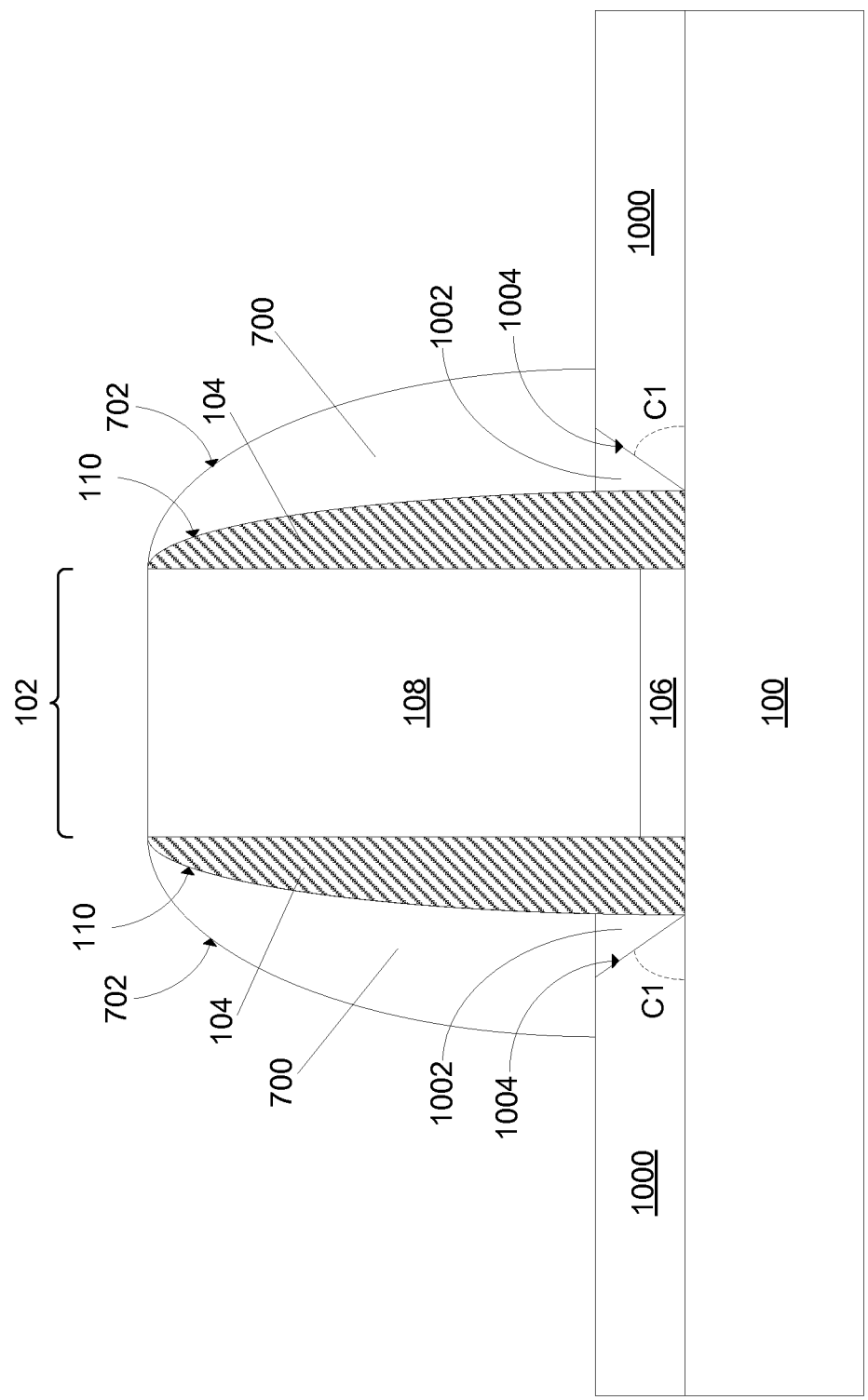
FIG. 10A is a vertical cross-sectional view of the semiconductor structure shown in FIG. 8, according to another embodiment of the present invention, after a first layer of epitaxial RSD regions having a faceted side portion are selectively grown to contact a substantial portion of the bottom surfaces of the second spacers, creating an air-gap spacer region.

Referring now to FIG. 10A, and in another embodiment, the RSD regions may be formed in two layers. A first RSD layer 1000 may be formed on the surface of the semiconductor substrate 100 in the open regions 802 of structure 800 (shown in FIG. 8). The first RSD layer 1000 may be comprised of the same materials as the RSD regions 200 and formed using the same processes and techniques described above in forming the RSD regions 200 in reference to FIG. 2. The first RSD layer 1000 may contact the first sidewalls 110 at the surface of the semiconductor substrate 100 and may have a faceted side portion 1004 that rises in a direction normal to the surface of the semiconductor substrate 100 at an angle C1 from approximately 30 degrees to approximately 75 degrees relative to a bottom surface of the RSD regions 1000. The faceted side portion 1004 may contact a substantial portion of a bottom surface of the second spacers 700. The space between the first sidewalls 110, the faceted side portions 1004, and the bottom surfaces of the second spacers 700 is sealed off, creating an air gap spacer region 1002.

Figure 10B:
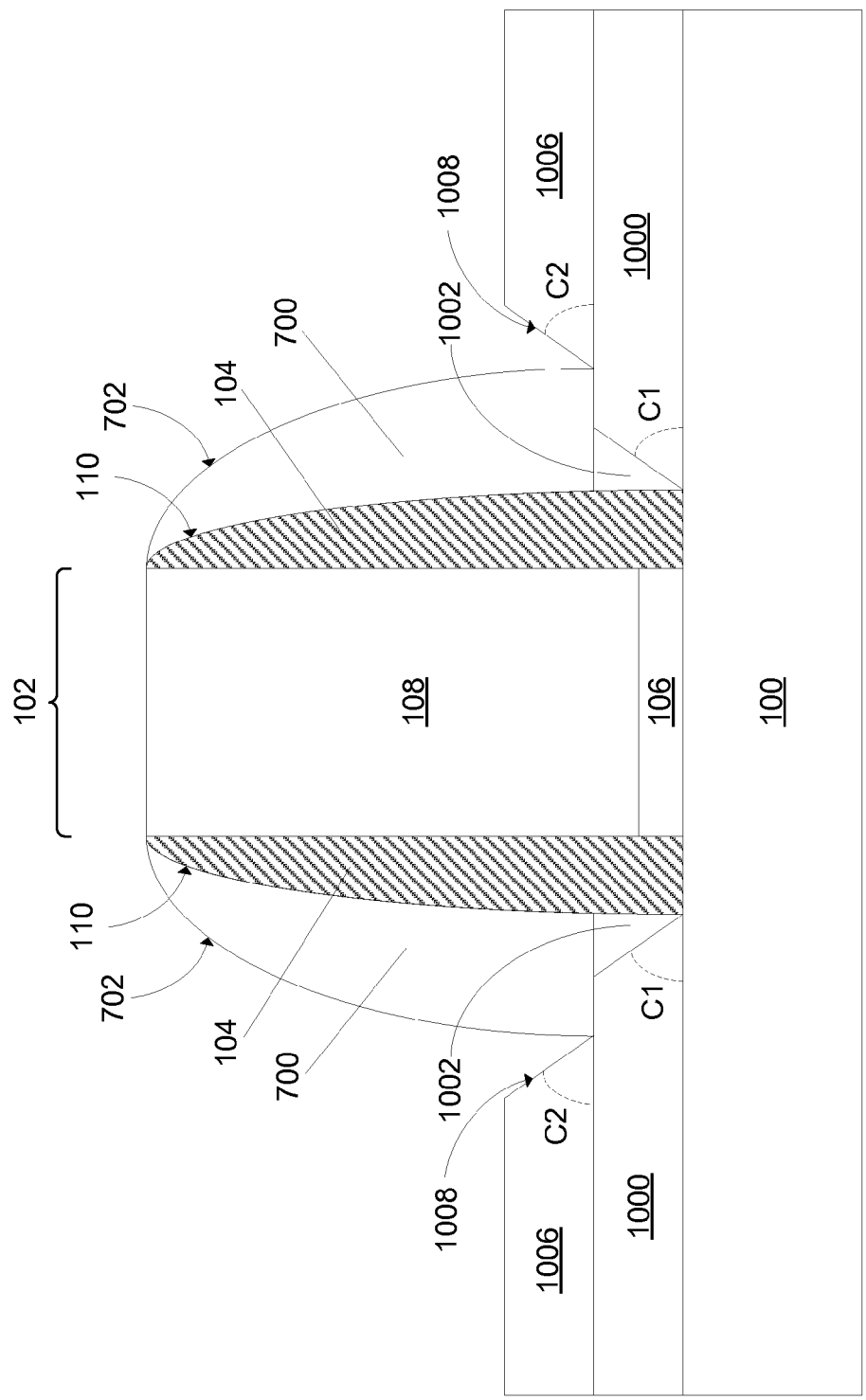
FIG. 10B is a vertical cross-sectional view of the semiconductor structure shown in FIG. 10A after a second layer of epitaxial RSD regions having a faceted side portion is formed on the top surface of the first layer of epitaxial RSD regions, according to an embodiment of the present invention.

Referring now to FIG. 10B, after the first RSD layer 1000 is formed, a second RSD layer 1006 may be formed on the surface of the first RSD layer 1000. The second RSD layer 1006 may be comprised of the same materials as the RSD regions 200 and formed using the same processes and techniques described above in forming the RSD regions 200 in reference to FIG. 2. The second RSD layer 1006 may contact the second sidewalls 702 at the surface of the first RSD layer 1000 and may have a faceted side portion 1008 that rises in a direction normal to the surface of the semiconductor substrate 100 at an angle C2 from approximately 30 degrees to approximately 75 degrees relative to a bottom surface of the second RSD layer 1006.

Figure 11A:
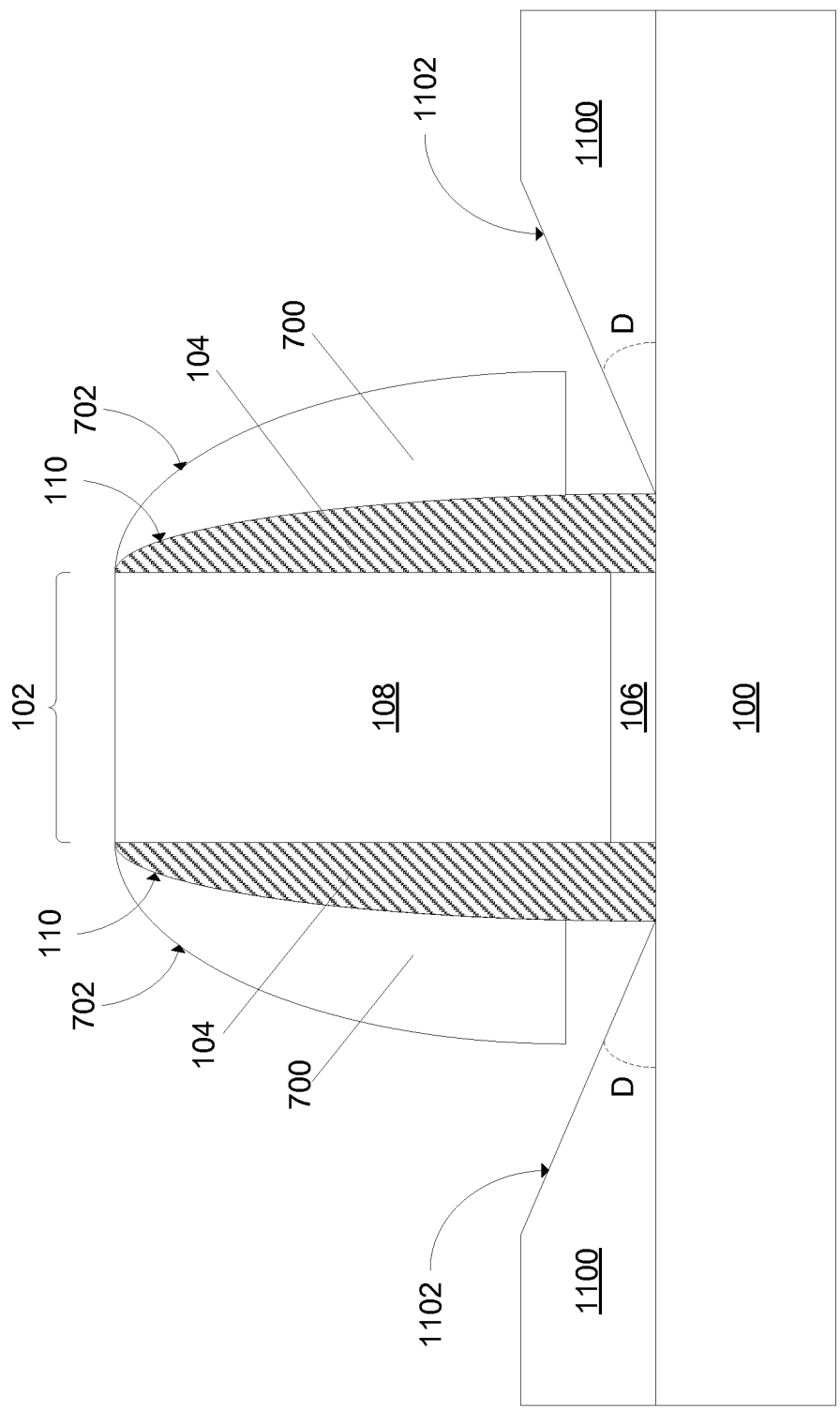
FIG. 11A is a vertical cross-sectional view of the semiconductor structure shown in FIG. 8, according to another embodiment of the present invention, after epitaxial RSD regions having faceted side portions that do not contact the second spacers have been formed on the surface of the semiconductor substrate.

Referring now to FIG. 11A, and in another embodiment, RSD regions 1100 may be formed on the surface of the semiconductor substrate 100 in the open regions 800 of the structure 800 (shown in FIG. 8). The RSD regions 1100 may be comprised of the same materials as the RSD regions 200 and formed using the same processes and techniques described above in forming the RSD regions 200 in reference to FIG. 2. The RSD regions 1100 may contact the first sidewalls 110 at the surface of the semiconductor substrate 100 and may have a faceted side portion 1102 that rises in a direction normal to the surface of the semiconductor substrate 100 at an angle D from approximately 20 degrees to approximately 60 degrees relative to a bottom surface of the RSD regions 1100 without contacting the bottom surfaces of the second spacers 700.

Figure 11B:
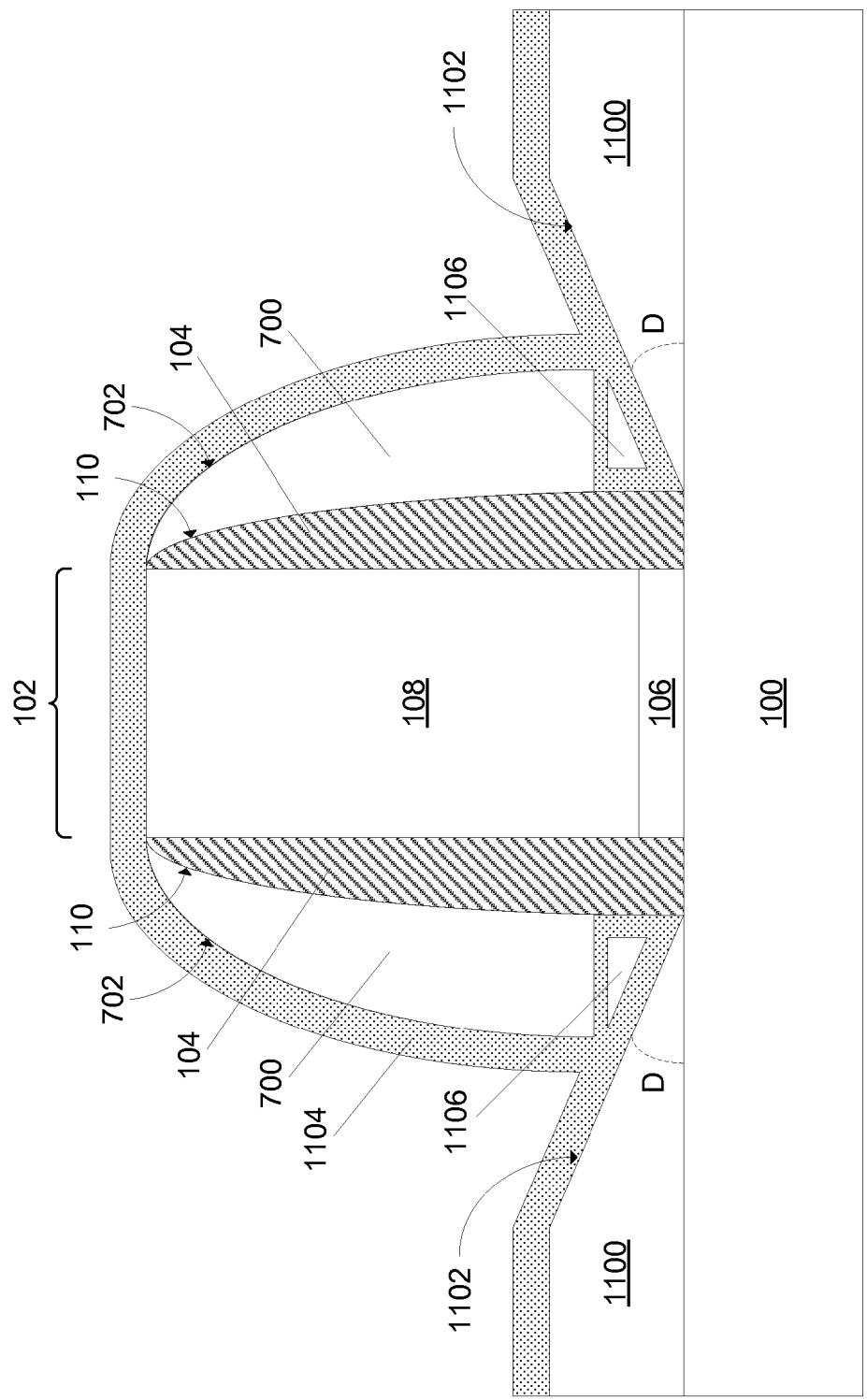
FIG. 11B is a vertical cross-sectional view of the semiconductor structure shown in FIG. 11A, after a conformal spacer layer has been formed over the surface of the semiconductor structure creating air-gap spacer regions, according to an embodiment of the present invention.

Referring now to FIG. 11B, a conformal spacer layer 1104 may be formed on the second sidewalls 702, the bottoms of the second spacers 700, the RSD regions 1100, the faceted side portions 1102, and the first sidewalls 110. The conformal spacer layer 1104 may be comprised of the same materials as the second spacers 400 and formed using the same processes and techniques described above in forming the second spacers 400 in reference to FIG. 4. The deposition of the conformal spacer layer 1104 may form an air-gap spacer region 1106 in the area between the first sidewalls 110, the bottom surfaces of the second spacers 700, and the RSD regions 1100.

Figure 11C:
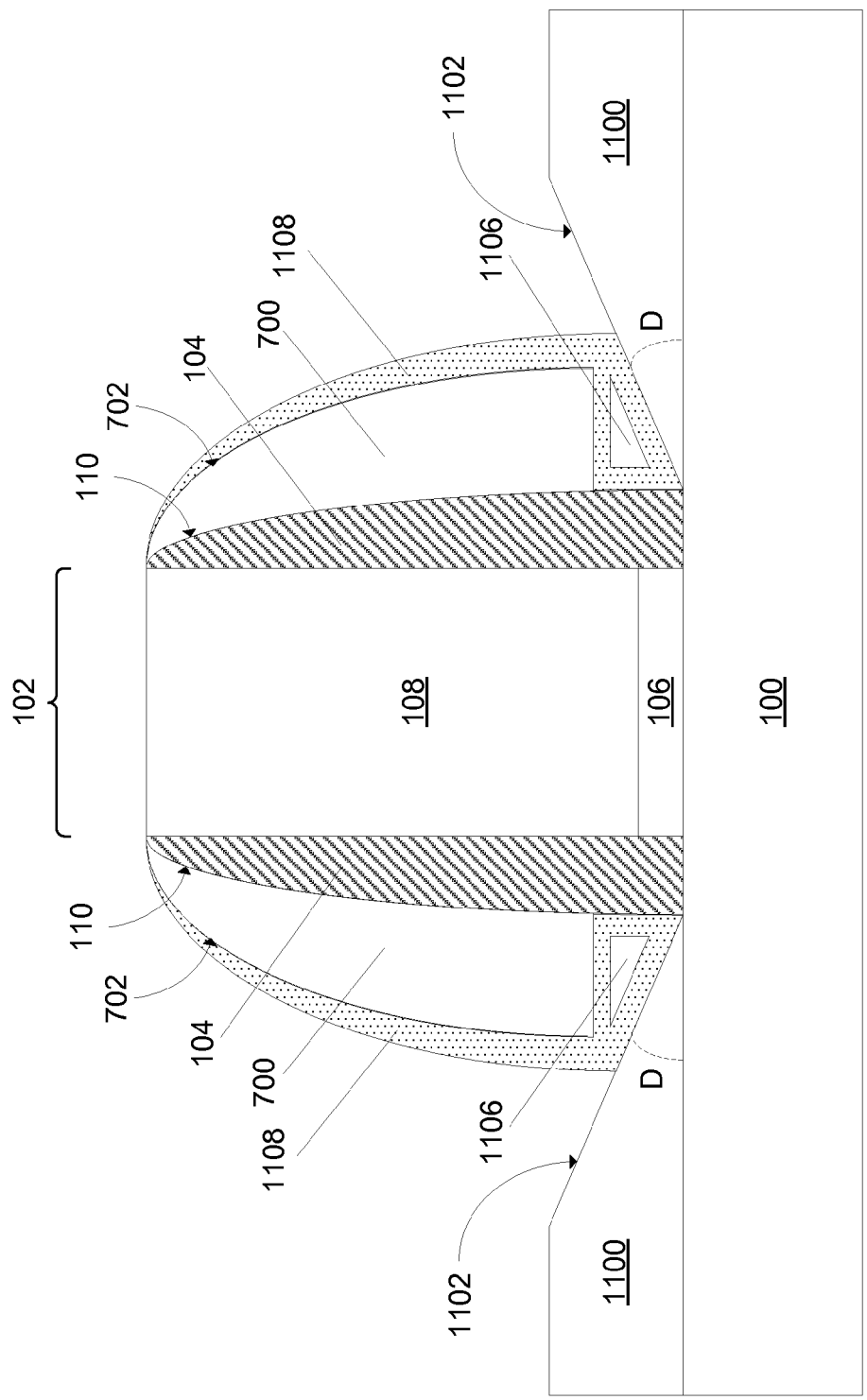
FIG. 11C is a vertical cross-sectional view of the semiconductor structure shown in FIG. 11B after the conformal spacer layer has been partially removed to create conformal spacers, according to an embodiment of the present invention.

Referring now to FIG. 11C, after deposition, the conformal spacer layer 1104 (shown in FIG. 11B) may be anisotropically etched so that a remaining portion of the conformal spacer layer 1104 is present as conformal spacers 1108 on the second sidewalls 702, the bottom surfaces of the second spacers 700, the first sidewalls 110, and a portion of the faceted side portion 1102. An anisotropic etch process is a material removal process in which the etch rate in the direction normal to the surface to be etched is greater than the direction parallel to the surface to be etched. The anisotropic etch may be performed by well known methods such as, but not limited to, include RIE, ion beam etching, plasma etching, or laser ablation.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A method of forming a semiconductor device, the method comprising:
    forming a gate portion on a surface of a semiconductor substrate, the gate portion having gate sidewalls;

forming gate spacers on the gate sidewalls and on the surface of the semiconductor substrate, the gate spacers having first sidewalls opposite the gate sidewalls;

forming raised source/drain (RSD) regions on the surface of the semiconductor substrate, the RSD regions having a faceted side portion contacting the gate spacers at the surface of the semiconductor substrate, thereby forming cavity regions defined by the first sidewalls and the faceted side portion of the RSD regions;

filling the cavity regions with a dielectric material, thereby forming dielectric regions; and forming second spacers on the first sidewalls and on a top surface of the dielectric regions, the second spacers having second sidewalls.

2. The method of claim 1, further comprising forming a silicide layer on an upper surface of the RSD regions, the silicide layer contacting the second sidewalls.

3. The method of claim 1, wherein the forming RSD regions comprises selectively growing the faceted side portion to rise in a direction normal to the surface of the semiconductor substrate at an angle from approximately 20 degrees to approximately 75 degrees relative to a bottom surface of the RSD regions.

4. The method of claim 1, wherein the filling the cavity regions comprises depositing a low-k dielectric material with a dielectric constant less than approximately 4.0.

5. The method of claim 1, wherein the filling the cavity regions comprises depositing dielectric material with a dielectric constant ranging from approximately 4.0 to approximately 7.0.

6. The method of claim 1, wherein the forming the gate portion on the surface of the semiconductor substrate comprises:

forming at least one gate dielectric on the semiconductor substrate; and forming at least one gate conductor on the gate dielectric.

7. The method of claim 1, further comprising forming a dielectric cap on an upper surface of the gate portion.

8. The method of claim 1, wherein the forming the gate portion on the surface of the semiconductor substrate comprises:

forming a dummy gate on the semiconductor substrate.

9. The method of claim 1, wherein the faceted side portion of the RSD regions comprises epitaxial material in a 111 crystallographic plane.

10. The method of claim 1, wherein the dielectric regions have an upper surface that is below an upper surface of the RSD regions.

11. The method of claim 1, wherein the dielectric regions have an upper surface that is substantially flush with an upper surface of the RSD regions.

12. The method of claim 1, wherein the dielectric regions have an upper surface that is above an upper surface of the RSD regions.

13. The method of claim 1, wherein the dielectric material comprises $SiO_2$, $HfO_2$, $ZrO_2$, $Al_2O_3$, $TiO_2$, $La_2O_3$, $SrTiO_3$, $LaAlO_3$, $Y_2O_3$, or mixtures thereof.

14. The method of claim 1, wherein the dielectric material comprises boron nitride, carbon doped silicon oxide, fluorine doped silicon oxide, boron carbon nitride, hydrogen silsesquioxane polymer (HSQ), methyl silsesquioxane polymer (MSQ), polyphenylene oligomer, methyl doped silica, $SiO_x(CH_3)_y$, $SiC_xO_yH_y$, organosilicate glass (SiCOH), porous SiCOH, or mixtures thereof.

15. The method of claim 1, wherein the gate spacers comprise an oxide, a nitride, or an oxynitride.

16. The method of claim 1, wherein the second spacers comprise an oxide, a nitride, or an oxynitride.

17. The method of claim 1, wherein the RSD regions comprise SiGe doped with a n-type dopant.

18. The method of claim 1, wherein the RSD regions comprise SiGe doped with a p-type dopant.

19. The method of claim 2, wherein the forming the silicide layer on the upper surface of the RSD regions comprises:

forming a refractory metal layer on the RSD regions; and performing an annealing process to cause the refractory metal layer to react with the RSD regions.

20. The method of claim 13, wherein the refractory metal layer comprises Ni, Pt, Co, Ta, Ti, or alloys thereof.

* * * * *